United States Patent
Jorgensen

(10) Patent No.: US 7,495,566 B2
(45) Date of Patent: Feb. 24, 2009

(54) RESONANCE SECURITY TAG WITH AND METHOD OF PRODUCING SUCH A TAG

(76) Inventor: Poul Richter Jorgensen, Saugskærvej 16, Thurø, DK-5700, Svendborg (DK)

( * ) Notice: Subject to any disclaimer, the term of this patent is extended or adjusted under 35 U.S.C. 154(b) by 31 days.

(21) Appl. No.: 10/582,771

(22) PCT Filed: Dec. 16, 2004

(86) PCT No.: PCT/DK2004/000876

§ 371 (c)(1),
(2), (4) Date: Jun. 13, 2006

(87) PCT Pub. No.: WO2005/059855

PCT Pub. Date: Jun. 30, 2005

(65) Prior Publication Data

US 2007/0120680 A1    May 31, 2007

(30) Foreign Application Priority Data

Dec. 16, 2003    (DK) .............................. 2003 01862

(51) Int. Cl.
*G08B 13/14*    (2006.01)
(52) U.S. Cl. .............. 340/572.7; 340/572.1; 340/572.5; 340/572.8; 336/200
(58) Field of Classification Search .............. 340/572.5, 340/572.1, 572.7, 572.8; 336/200
See application file for complete search history.

(56) References Cited

U.S. PATENT DOCUMENTS

| 4,598,276 A | * | 7/1986 | Tait .......................... 340/572.5 |
| 6,097,291 A | * | 8/2000 | Tsai et al. ................ 340/572.6 |

FOREIGN PATENT DOCUMENTS

| DE | 36 02 848 A | 8/1987 |
| JP | 02-310696 A | 12/1990 |
| JP | 07-160959 A | 6/1995 |
| JP | 7160959 | * 6/1995 |

* cited by examiner

*Primary Examiner*—Benjamin C Lee
*Assistant Examiner*—Hongmin Fan
(74) *Attorney, Agent, or Firm*—Breiner & Breiner, LLC

(57) ABSTRACT

A resonance security tag (1) comprises a dielectric foil material (2) provided with conductive material layer patterns (3-7) on both sides. The conductive material layer patterns are formed to provide an inductor (3) and a capacitor (4, 6) positioned inside the inductor (3), and mutually connected to form a resonance circuit. By cutting (9) the capacitor (4, 6) free of the dielectric foil material (2) and folding the capacitor (4, 6) away from the position inside the inductor (3), this part is left free for the penetration of magnetic flux through the inductor (3), whereby the detection level is improved and a possibility of reducing the size of the resonance security tag is provided.

9 Claims, 4 Drawing Sheets

RESONANCE SECURITY TAG WITH AND METHOD OF PRODUCING SUCH A TAG

TECHNICAL FIELD

The present invention relates to a resonance security tag of the kind set forth in the preamble of claim 1 and a method of producing such a tag.

BACKGROUND ART

Resonance security tags of this kind are e.g. known to be used in electronic article surveillance systems (EAS systems) in order to detect unauthorised removal of articles from shops, stores or warehouses, and such resonance security tags are produced in large numbers on a dielectric foil material which is provided with conductive material layer patterns on both sides for forming an inductor and a capacitor forming a resonance circuit having a suitable resonance frequency and to be detected by means of suitable equipment positioned at the exit from the premises. A resonance security tag of this kind is e.g. known from EP-0,285,559.

From JP 02-310696 it is known to cut the foil material along part of the circumference of the capacitor elements and fold the cut-free capacitor away from inside the inductor in order to leave this part free for the penetration of magnetic flux through the inductor. However, experiments with this type of EAS-tag have shown a considerable variance in resonance frequency leading to reduced detection rates for such tags, and the present inventor has not seen any EAS-tags on the market which are produced in accordance with the method described in JP-02-310696.

DISCLOSURE OF THE INVENTION

It is the object of the present invention to provide a resonance security tag of the kind referred to above, with which it is possible to improve the detection level, maintain a precise resonance frequency, and at the same time possibly reducing or maintaining the small size of the resonance security tag, and this object is achieved with a resonance security tag of the kind, which according to the present invention also comprises the features set forth in the characterising clause of claim 1. With this arrangement, the central part of the inductor is made free in order to allow penetration of the magnetic flux through the inductor, whereby a higher detection rate is achieved, and the resonance frequency is maintained within narrow limits despite the folding operation due to the folding being performed to the side opposite the inductor pattern and presence of a shielding plate having a form and size corresponding to the form and size of the folded over capacitor plates improving the frequency precision. Furthermore, the present invention relates to a method of producing such a tag.

Preferred embodiments of the resonance security tag in accordance with the present invention, the advantages of which will be evident from the following description, are revealed in the subordinate claims.

BRIEF DESCRIPTION OF THE DRAWINGS

In the following detailed part of the present description, the invention will be explained in more detail with reference to the exemplary embodiments of a resonance security tag according to the invention shown in the drawings, in which FIG. 1 schematically shows a tag positioned between a transmitter and a receiver at the exit from the store or like for detecting the presence of the tag at the exit, FIG. 2 schematically shows an equivalent circuit diagram of the situation shown in FIG. 1 for explaining the parameters for improving the detection level.

DESCRIPTION OF THE PREFERRED EMBODIMENTS

Figure 1:
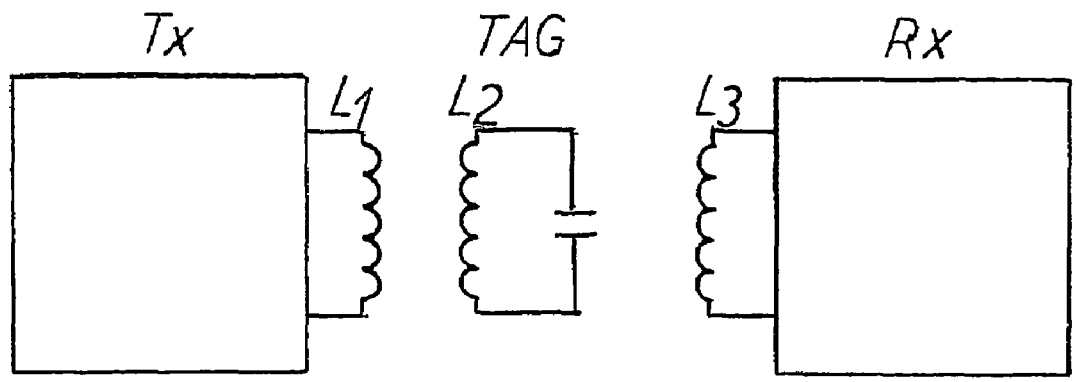
Figure 2:
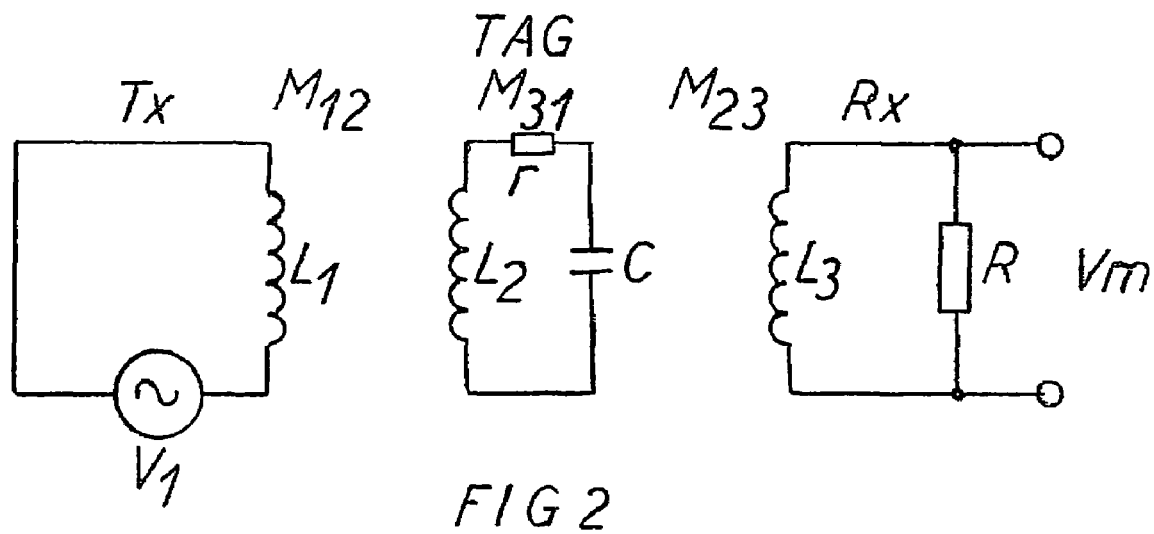

Referring to FIGS. 1 and 2, the quality of a resonance security tag is discussed in the following. In FIGS. 1 and 2, the tag 1 is positioned between a transmitter Tx in an electronic article surveillance system (EAS system), and a receiver Rx of said system. The transmitter transmits a radio frequency signal within a specific frequency range and whenever a tag with at resonance frequency within this range is within the range of the transmitter and the receiver, the receiver will be able to detect the resonance frequency of the tag.

The detection rate or quality will be dependent on the Q-value of the resonance circuit and the physical size thereof. The formula $$Q = \frac{1}{r}\sqrt{\frac{L}{C}} \tag{1}$$

indicates that in order to obtain a high Q-value, it is desired to have a small value of r, a high value of L and a small value of C. A low value of r can be obtained by choosing a conductive material layer in the tag like e.g. silver and a high value of L can be obtained by providing several windings in the inductor and at the same time the capacitor can be chosen with a small capacitance C.

In practice, however, this is not how it is done due to the fact that the price of silver is too high and many windings of the inductor coil will demand more material and surface area for the tag, which would increase the price of the tag. Furthermore, if many small windings are chosen in order to save material costs for the conductive material layer, the value of r will increase. If a very small value of C of e.g. 10 pF is chosen, the resonance circuit will be sensitive to external influence such as stray capacities, which would change the resonance frequency.

As can be seen from the above, the design of the resonance circuit for an EAS system is a compromise between price and size, among other things. In the market there is a wish for a cheap tag as well as a small tag with a high rate of detection and Q-value. Accordingly, the resonance circuit normally comprises a dielectric foil material 2 of polypropylene or polyethylene provided with an electrically conductive material layer pattern on both sides, said conductive material usually being of aluminium.

The electrical equivalent diagram shown in FIG. 2 corresponds in principle to an EAS system and the mutual induction coefficients between the inductors L1, L2 and L3 are M12 and M23, respectively. The loss resistance in the resonance circuit in the tag is represented by r. The input resistance in the measuring circuit is represented by R. The measured voltage Vm represents the signal strength from the resonance security tag. The resonance circuit L2,r,C is positioned between the transmitter coil L1 and the receiver coil L3. The formula for the received signal strength Vm is $$Vm = \omega_0 (M12 \cdot M23 / L1) \cdot \frac{V1}{r} \quad (2)$$

where $\omega_0$ is equal to $2\pi f_0$ ($f_0$ is the resonance frequency). V1 is the voltage of the signal generator. When the coils L1, L2 and L3 (the cross-sections S1, S3>S2), are arranged as shown, the mutual inductances are $$M12 = K12 \sqrt{S2\ L2} \text{ and } M23 = K23 \sqrt{S2\ L2} \quad (3),$$

where K12 and K23 are constants. Using (2) and (3), we have:

$$Vm = K12\ K23\ (V1/L1)\ (\omega_0 L2/r) S2 = K^*Q^*S \quad (4)$$

K is a constant and Q is a measure for the quality of the resonance circuit $$Q = \frac{1}{r}\sqrt{\frac{L}{C}}$$

S is the area surrounded by the magnetic flux. From the above it can be seen that Vm is proportional to Q*S.

In order to improve the tag, it is possible to increase Q or S or both.

Figure 3:
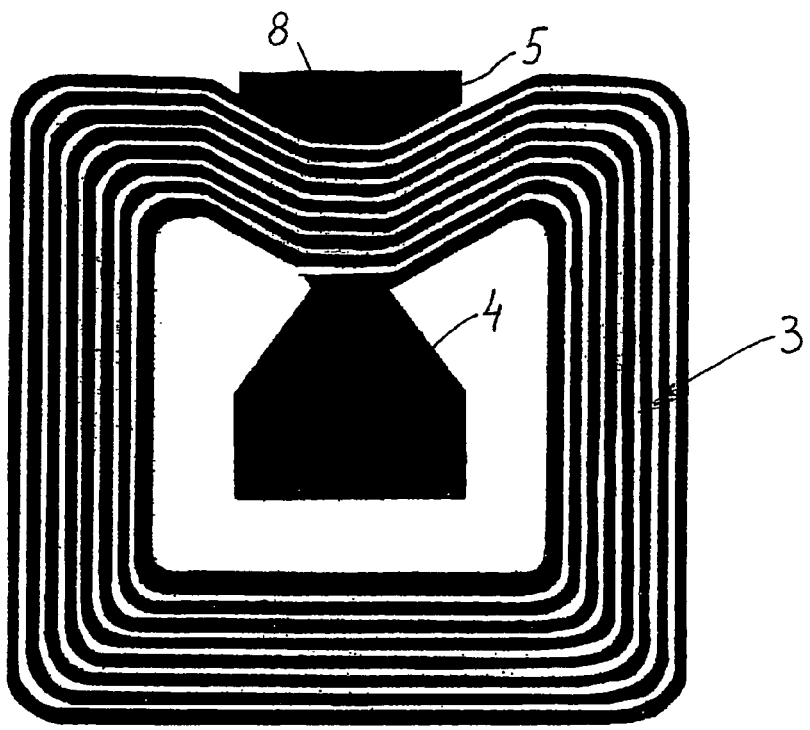
FIG. 3 shows the conductive material layer pattern on a first side of the dielectric foil material of a resonance security tag in accordance with the present invention.
Figure 4:
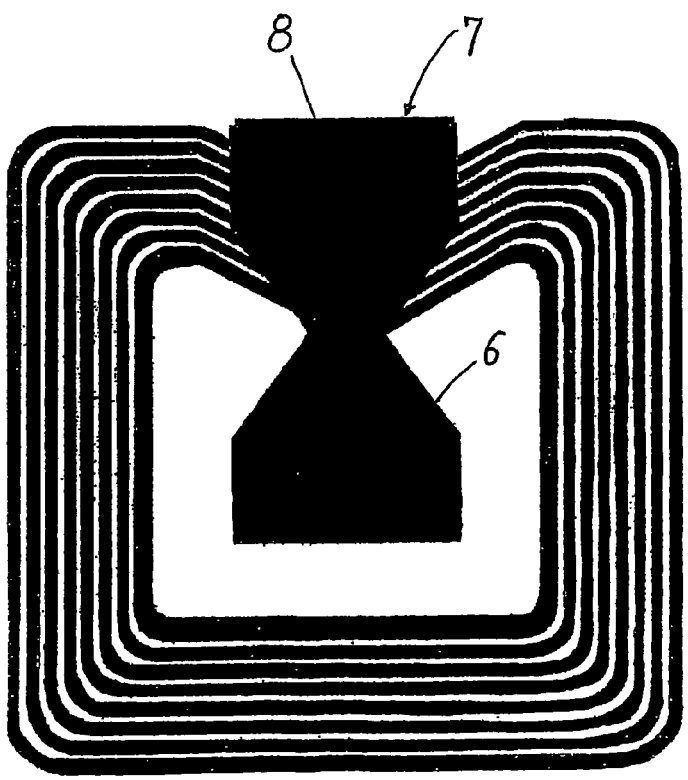
FIG. 4 shows the conductive material layer pattern on both sides of the dielectric foil material of a resonance security tag in accordance with the present invention.

The magnetic flux, which has to pass through the centre of the coil, is partially blocked by the capacitor in this position in a normal tag, referring to FIGS. 3 and 4. In order to increase the magnetic flux through the coil centre, it is desired to make the area of the capacitor as small as possible. As mentioned earlier, a certain minimum size of the capacitor is given, which leads to a restriction of the area in the centre of the coil which is free to allow the magnetic flux through the coil. The present invention removes the capacitor from the centre of the coil, whereby the magnetic flux through the coil centre is increased and thus the detection rate for the EAS system is increased considerably.

In FIG. 3 is shown the conductive material layer pattern on the first side of the dielectric foil material 2, which is formed to provide an inductor 3, a first capacitor plate 4 connected to a first end of the inductor 3 and positioned inside the inductor 3, and a first connection element 5 connected to an opposite end of the inductor 3. In FIG. 4 the conductive material layer pattern on the second, opposite side of the dielectric foil material 2 is shown superposed on the pattern of FIG. 3. The conductive material layer pattern on the second side of the dielectric foil material 2 is formed to provide a second capacitor plate 6 confronting the first capacitor plate 4 and a shielding plate 7 connected to the capacitor plate 6 and confronting the first connection element 5. The shielding plate 7 provides a patch of conductive material layer with a form and size corresponding to the form and size of the first and the second capacitor plate 4, 6.

Figure 5:
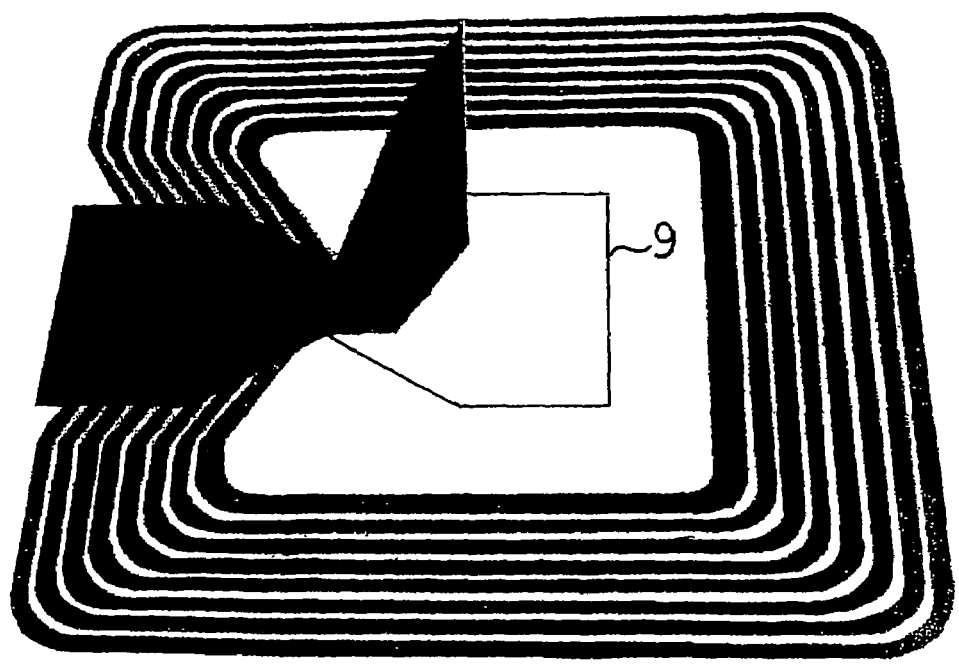
FIG. 5 shows schematically in a perspective view a partially folded cut free capacitor of a resonance security tag in accordance with FIGS. 3 and 4.
Figure 6:
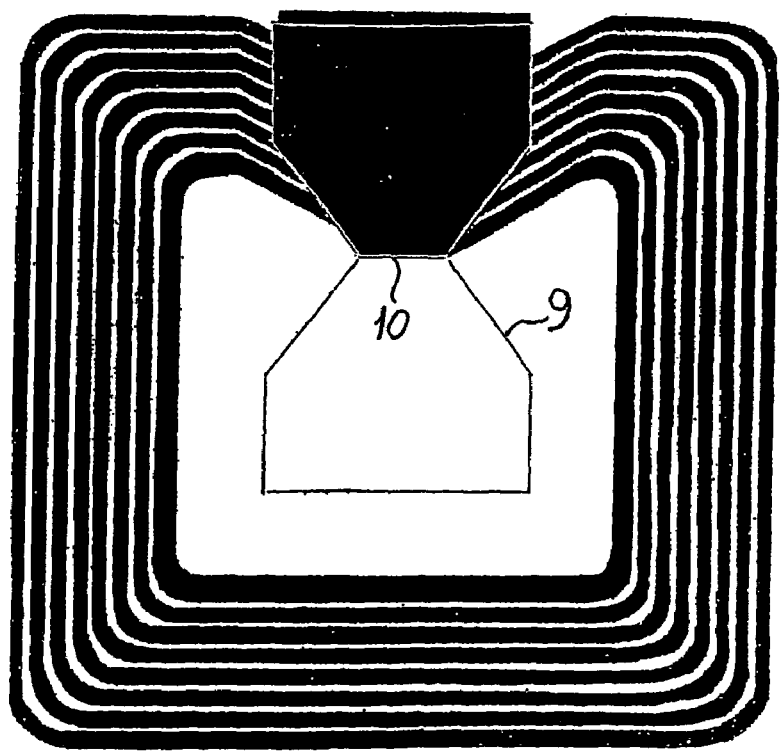
FIG. 6 shows the resonance security tag of FIG. 5 with the capacitor in a completely folded position, FIG. 7 schematically shows suggested instruments for performing the folding of the capacitor.

As shown schematically in FIG. 5, the capacitor plates 4, 6 have been cut 9 along part of the circumference of the first and second capacitor plates 4, 6 in order to fold the capacitor 4, 6 away from the central position inside the inductor 3. As shown in FIG. 6, the cut-free capacitor 4, 6 is folded completely along the folding line 10 over to overlay the shielding plate 7.

Due to the fact that the capacitive coupling between the shielding plate 7 and the windings of the inductor 3 is constant, the folding of the capacitor 4, 6 to overlay the shielding plate 7 will result in a well defined controlled change in resonance frequency. The distance between the folded over capacitor 4, 6 and the shielding plate 7 is precisely fixed.

In order to compensate for possible mechanical tolerances in the folding of the capacitor, the shielding plate 7 is preferably provided with dimensions larger than the capacitor plates 4, 6 such that the folded over capacitor plates 4,6 will always be positioned inside the circumference of the shielding plate 7.

The electrical contact 8 between the first connection element 5 and the shielding plate 7 is preferably provided by irregular holes through the dielectric foil material 2 in the area of these elements 5, 7 before or after the folding of the capacitor plates 4, 6.

Figure 7:
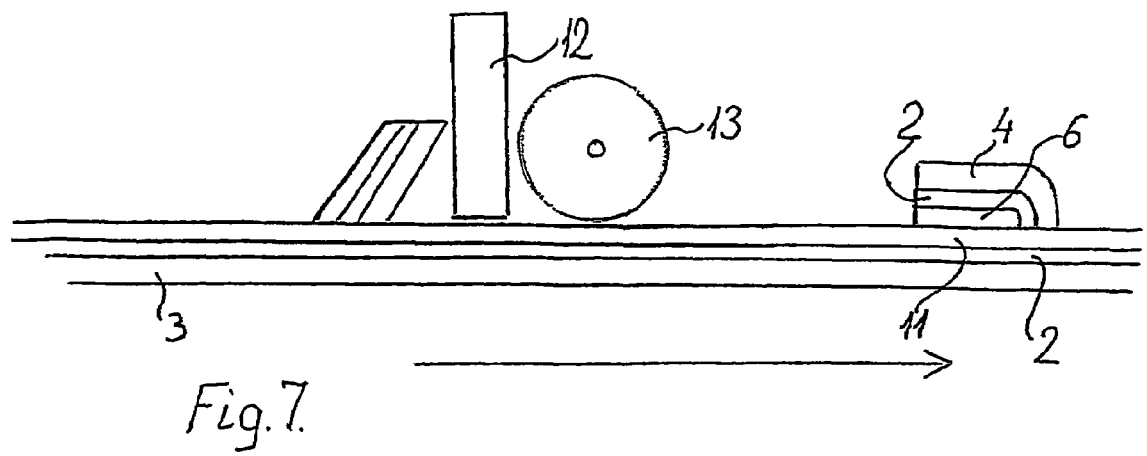

The cut 9 along part of the circumference of the first and second capacitor plates 4, 6 can be provided by mechanical means, by laser cutting, by heating the capacitor plates 4, 6, etc. The first part of the folding of the capacitor 4, 6 may be provided by mechanical means or by means of a jet of air, etc. An example of mechanical means for providing the folding of the capacitor 4, 6 is shown in FIG. 7, in which a folding tool 12 is positioned stationary over the foil material 2 and the foil material is moved towards this folding tool which folds the turned up capacitor 4, 6. In order to move the folded capacitor 4, 6 into intimate contact with the shielding plate 7 on the upper side of the tag, a further roller-formed tool 13 is positioned immediately after the folding tool 12 seen in the movement direction of the foil 2.

The tag in accordance with the present invention is especially suited to be used as an EAS tag for a CD or DVD due to the fact that the hole in the middle can be positioned over the hole in the CD or DVD and the coil can be positioned so as to surround this hole in a position in which the CD or DVD has no metallic layer and thus allows the radio frequency field to pass through the area where the tag is positioned. This would not have been possible with a conventional tag due to the fact that a tag of this small size would not be detectable in an EAS system when the tag is produced in accordance with the conventional technique.

Figure 8:
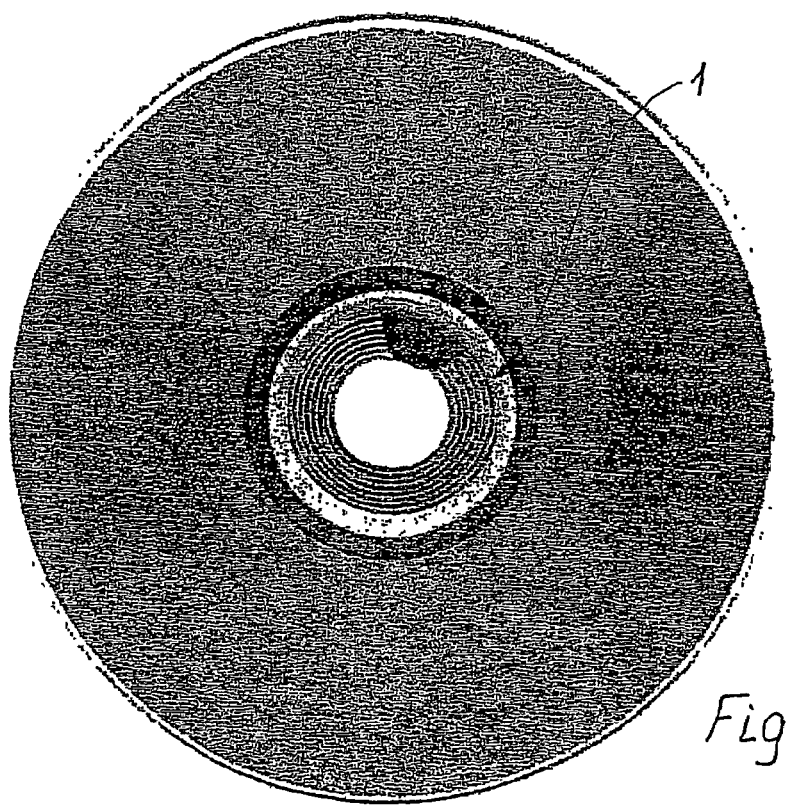
FIG. 8 shows an alternative embodiment of the resonance security tag specially formed to be positioned on or inside a CD or DVD in accordance with a preferred embodiment of the present invention.

The tag in accordance with the present invention can, as shown in FIG. 8, be positioned centrally in a CD or DVD and may be integrated into the DVD between the layers of the DVD. In this situation the EAS tag cannot be removed without destroying the DVD.

The construction in accordance with the present invention has improved the specifications of the resonance circuit to an extent that allows a 10-20% reduction in the size of the resonance circuit. Due to the fact that material costs are the main costs in producing such tags, this reduction in size leads to a corresponding reduction in price for the tags.

Above, the invention has been described in connection with preferred embodiments thereof, however, many modifications may be envisaged by a person skilled in the art without departing from the scope of the following claims.

The invention claimed is:

1. Resonance security tag comprising a dielectric foil material provided with a conductive material layer pattern on a first side and a second side of said dielectric foil material, said conductive material layer pattern on the first side of the dielectric foil material being formed to provide an inductor, a first capacitor plate being connected to a first end of the inductor and positioned inside the inductor, and a first connection element connected to an opposite second end of the inductor, the conductive material layer pattern on the second side of the dielectric foil material being formed to provide a second capacitor plate confronting the first capacitor plate and a second connection element, formed to provide an electrical shielding plate, connected to the second capacitor plate and confronting the first connection element, the first connection element and the second connection element being electrically connected, and the dielectric foil material being cut along part of a circumference of the first capacitor plate and the second capacitor plate to provide a cut-free capacitor which is folded away from a position inside the inductor, thus leaving such part free for penetration of magnetic flux through the inductor, wherein the cut-free capacitor is folded to the second side of the dielectric foil material to provide a folded-over capacitor overlaying the shielding plate and extending across a section of said inductor.

2. Resonance security tag in accordance with claim 1, wherein the shielding plate has a form and size corresponding to form and size of the folded-over capacitor.

3. Resonance security tag in accordance with claim 1, wherein each conductive material layer pattern is formed in such a way that the tag can be positioned on or inside a CD or DVD with a hole from the folded-over capacitor positioned around a central hole in the CD or DVD.

4. Resonance security tag in accordance with claim 2, wherein each conductive material layer pattern is formed in such a way that the tag can be positioned on or inside a CD or DVD with a hole from the folded-over capacitor positioned around a central hole in the CD or DVD.

5. Method of producing a resonance security tag in accordance with claim 1, said method comprising steps of providing the dielectric foil material with the conductive material layer pattern on the first side and the second side thereof, each said conductive material layer pattern being formed to provide the inductor and the first capacitor plate and the second capacitor plate forming a resonance circuit with the first capacitor plate and the second capacitor plate positioned inside the inductor, and further comprising a step of cutting the dielectric foil material along part of a circumference of the first capacitor plate and the second capacitor plate to provide a cut-free capacitor and folding the cut-free capacitor away from a position inside the inductor, thus leaving such part free for penetration of magnetic flux through the inductor, wherein the folding is performed to fold the cut-free capacitor to that side of the tag opposite that side on which the conductive material layer pattern is formed to provide the inductor.

6. Method in accordance with claim 5, wherein the folding is performed by producing a preliminary folding using a jet of air or mechanical means to turn up the cut-free capacitor, and followed by passage of the security tag past a folding tool and a roller, whereby the capacitor is completely folded and pressed into intimate contact with a surface of the resonance security tag.

7. Method of producing a resonance security tag in accordance with claim 2, said method comprising steps of providing the dielectric foil material with the conductive material layer pattern on the first side and the second side thereof, each said conductive material layer pattern being formed to provide the inductor and the first capacitor plate and the second capacitor plate forming a resonance circuit with the first capacitor plate and the second capacitor plate positioned inside the inductor, and further comprising a step of cutting the dielectric foil material along part of a circumference of the first capacitor plate and the second capacitor plate to provide a cut-free capacitor and folding the cut-free capacitor away from a position inside the inductor, thus leaving such part free for penetration of magnetic flux through the inductor, wherein the folding is performed to fold the cut-free capacitor to that side of the tag opposite that side on which the conductive material layer pattern is formed to provide the inductor.

8. Method of producing a resonance security tag in accordance with claim 3, said method comprising steps of providing the dielectric foil material with the conductive material layer pattern on the first side and the second side thereof, each said conductive material layer pattern being formed to provide the inductor and the first capacitor plate and the second capacitor plate forming a resonance circuit with the first capacitor plate and the second capacitor plate positioned inside the inductor, and further comprising a step of cutting the dielectric foil material along part of a circumference of the first capacitor plate and the second capacitor plate to provide a cut-free capacitor and folding the cut-free capacitor away from a position inside the inductor, thus leaving such part free for penetration of magnetic flux through the inductor, wherein the folding is performed to fold the cut-free capacitor to that side of the tag opposite that side on which the conductive material layer pattern is formed to provide the inductor.

9. Method of producing a resonance security tag in accordance with claim 4, said method comprising steps of providing the dielectric foil material with the conductive material layer pattern on the first side and the second side thereof, each said conductive material layer pattern being formed to provide the inductor and the first capacitor plate and the second capacitor plate forming a resonance circuit with the first capacitor plate and the second capacitor plate positioned inside the inductor, and further comprising a step of cutting the dielectric foil material along part of a circumference of the first capacitor plate and the second capacitor plate to provide a cut-free capacitor and folding the cut-free capacitor away from a position inside the inductor, thus leaving such part free for penetration of magnetic flux through the inductor, wherein the folding is performed to fold the cut-free capacitor to that side of the tag opposite that side on which the conductive material layer pattern is formed to provide the inductor.

* * * * *

UNITED STATES PATENT AND TRADEMARK OFFICE
CERTIFICATE OF CORRECTION

| | | |
|---|---|---|
| PATENT NO. | : 7,495,566 B2 | |
| APPLICATION NO. | : 10/582771 | |
| DATED | : February 24, 2009 | |
| INVENTOR(S) | : Poul Richter Jørgensen | |

It is certified that error appears in the above-identified patent and that said Letters Patent is hereby corrected as shown below:

On the Title Page,

Item (54) "RESONANCE SECURITY TAG WITH AND METHOD OF PRODUCING SUCH A TAG"

should read

-- RESONANCE SECURITY TAG AND METHOD OF PRODUCING SUCH A TAG --.

Item (86) "§ 371 (c)(1), (2), (4) Date: Jun. 13, 2006"

should read -- § 371 (c)(1), (2), (4) Date: July 26, 2006 --.

Column 1,

Lines 1 and 2, "RESONANCE SECURITY TAG WITH AND METHOD OF PRODUCING SUCH A TAG"

should read

-- RESONANCE SECURITY TAG AND METHOD OF PRODUCING SUCH A TAG --.

Column 3,

Line 23, " $M12 = K12\sqrt{S2\ L2}$ and $M23 = K23\sqrt{S2\ L2}$ (3) "

should read -- $M12 = K12\sqrt{S2\ L2}$ and $M23 = K23\sqrt{S2\ L2}$ (3) --.

Line 28, " $Vm = K12\ K23\ (V1/L1)\ (\omega_0 L2/\eta)S2 = K^*Q^*S$ "

should read -- $Vm = K12\ K23\ (V1/L1)\ (\omega_0 L2/\eta)S2 = K^*Q^*S$ --.

UNITED STATES PATENT AND TRADEMARK OFFICE
CERTIFICATE OF CORRECTION

PATENT NO. : 7,495,566 B2  
APPLICATION NO. : 10/582771  
DATED : February 24, 2009  
INVENTOR(S) : Poul Richter Jørgensen It is certified that error appears in the above-identified patent and that said Letters Patent is hereby corrected as shown below:

Line 37, "proportional to Q*S" should read -- proportional to Q∗S --.

Signed and Sealed this

Ninth Day of June, 2009

JOHN DOLL  
*Acting Director of the United States Patent and Trademark Office*